United States Patent
Yang et al.

(10) Patent No.: US 10,736,209 B2
(45) Date of Patent: Aug. 4, 2020

(54) CIRCUIT BOARD STRUCTURE AND CONDUCTIVE TRANSMISSION LINE STRUCTURE THEREOF

(71) Applicants: Global Unichip Corporation, Hsinchu (TW); Taiwan Semiconductor Manufacturing Co., Ltd., Hsinchu (TW)

(72) Inventors: Sheng-Fan Yang, Hsinchu (TW); Yuan-Hung Lin, Hsinchu (TW); Yu-Cheng Sun, Hsinchu (TW)

(73) Assignees: Global Unichip Corporation, Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 43 days.

(21) Appl. No.: 16/276,619

(22) Filed: Feb. 15, 2019

(65) Prior Publication Data

US 2020/0107431 A1 Apr. 2, 2020

(30) Foreign Application Priority Data

Sep. 27, 2018 (TW) .............................. 107134038 A (51) Int. Cl.
- *H03H 7/38* (2006.01)
- *H05K 1/02* (2006.01)
- *H01P 3/08* (2006.01)

(52) U.S. Cl.
CPC .............. *H05K 1/025* (2013.01); *H01P 3/08* (2013.01); *H03H 7/38* (2013.01); *H05K 1/0245* (2013.01);
(Continued)

(58) Field of Classification Search
CPC .. H03H 7/38; H01P 3/026; H01P 3/08; H05K 1/025; H05K 1/0245; H05K 1/115;
(Continued)

(56) References Cited

U.S. PATENT DOCUMENTS 6,812,803 B2 11/2004 Goergen
9,996,653 B1 * 6/2018 Shen ................ H01R 13/62994
(Continued)

FOREIGN PATENT DOCUMENTS

TW M456046 6/2013
TW 201340791 10/2013
(Continued)

OTHER PUBLICATIONS

"Office Action of Taiwan Counterpart Application", dated Jun. 12, 2019, p. 1-p. 3.

*Primary Examiner* — Stephen E. Jones
(74) *Attorney, Agent, or Firm* — JCIPRNET (57) ABSTRACT

A conductive transmission line structure includes a first conductive transmission line and a second conductive transmission line. A first segment and a second segment of the first conductive transmission line are respectively disposed adjacent to a third segment and a fourth segment of the second conductive transmission line. Line widths of the first segment and the third segment are respectively smaller than line widths of the second segment and the fourth segment. A spacing between the first segment and the third segment is smaller than a spacing between the second segment and the fourth segment. The first segment and the third segment provide a first impedance, and the second segment and the fourth segment provide a second impedance. The first impedance is smaller than the second impedance. The first and the third signal transmission nodes receive a differential signal pair.

10 Claims, 7 Drawing Sheets

(52) U.S. Cl.
CPC .............. *H05K 2201/09236* (2013.01); *H05K 2201/09263* (2013.01)

(58) Field of Classification Search
CPC .......... H05K 2201/09227; H05K 2201/09236; H05K 2201/09681; H05K 2201/0187
USPC .............................. 333/33, 238, 246, 1, 4, 5
See application file for complete search history.

(56) References Cited

U.S. PATENT DOCUMENTS

2008/0078571 A1\* 4/2008 Imaoka ............... H01L 25/0657
174/262
2009/0009261 A1 1/2009 Song

FOREIGN PATENT DOCUMENTS

TW 201639230 11/2016
WO 03073808 9/2003

\* cited by examiner

CIRCUIT BOARD STRUCTURE AND CONDUCTIVE TRANSMISSION LINE STRUCTURE THEREOF

CROSS-REFERENCE TO RELATED APPLICATION

This application claims the priority benefit of Taiwan application serial no. 107134038, filed on Sep. 27, 2018. The entirety of the above-mentioned patent application is hereby incorporated by reference herein and made a part of this specification.

BACKGROUND OF THE DISCLOSURE

Field of the Disclosure

The present invention relates to a circuit board structure and a conductive transmission line structure thereof, and in particular relates to a circuit board structure capable of reducing signal transmission harmonics and a conductive transmission line structure thereof.

Description of Related Art

In a conventional layout method of a circuit board, conductive transmission lines for high-speed signal transmission are disposed on the circuit board and are often constructed by a single level method, especially for the circuit substrate of a flip chip package. However, in the above-mentioned layout method, multiple signal reflections often occur on a transmission path of a conductive transmission line, such as the signal reflections among a transmission node, a main transmission line, and a via.

Figure 1:
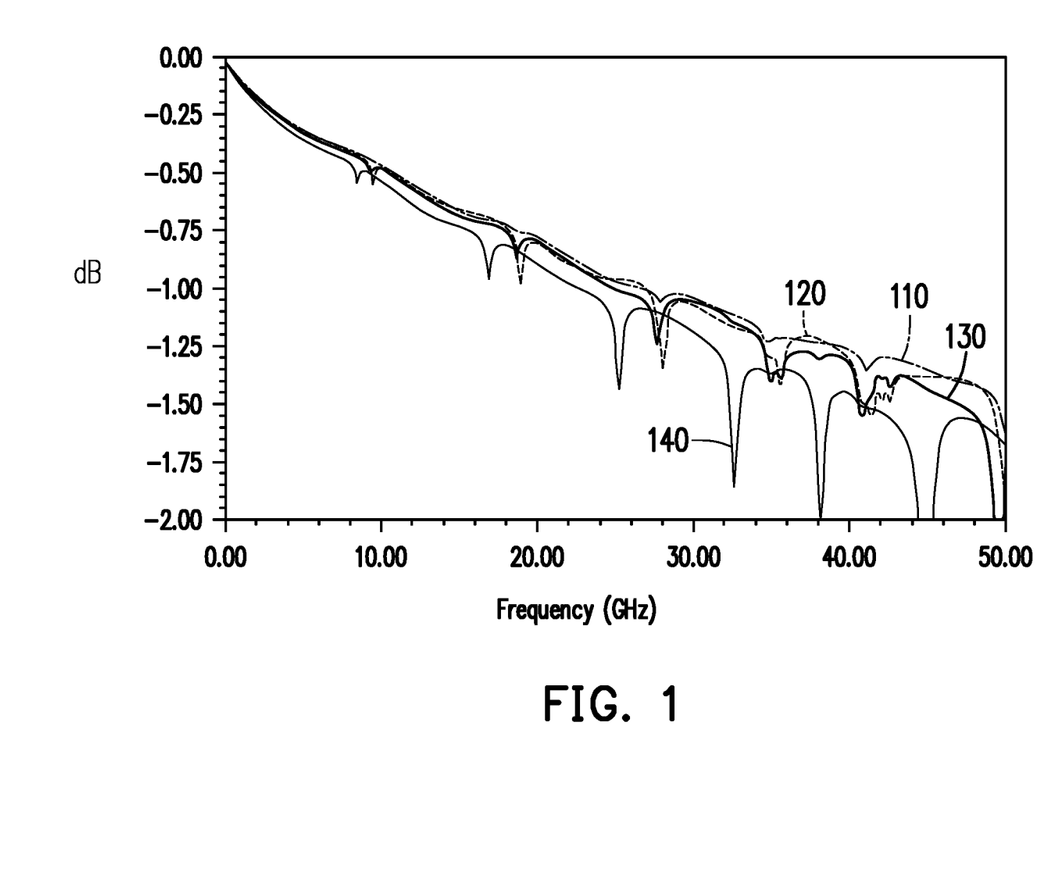
FIG. 1 is a S-Parameter plot of transmission signals on a circuit board according to a prior art.

Please refer to FIG. 1, which is a S-Parameter plot of transmission signals on a circuit board according to a prior art, the curves 110~140 shown in FIG. 1 respectively represent frequency responses of transmission signals from different transmission channels. The signal reflection phenomena shown on the curve 110~140 demonstrate that serious harmonic waves are generated on transmission signals when using conventional layout method, which greatly limits the transmission quality of transmission signals and reduces the working quality of circuit components on the circuit board.

SUMMARY OF THE DISCLOSURE

The invention provides a circuit board structure and a conductive transmission line structure thereof, which can effectively reduce the resonance phenomena generated during signal transmission.

According to an embodiment of the invention, a conductive transmission line structure includes a first conductive transmission line and a second conductive transmission line. The first conductive transmission line includes a first segment and a second segment. The first segment is coupled between a first signal transmission node and the second segment, and the second segment is coupled to a second signal transmission node. The second conductive transmission line includes a third segment and a fourth segment. The third segment is coupled between a third signal transmission node and the fourth segment, and the fourth segment is coupled to a fourth signal transmission node. The first segment is disposed adjacent to the third segment, and the second segment is disposed adjacent to the fourth segment. A line width of the first segment is smaller than a line width of the second segment, and a line width of the third segment is smaller than a line width of the fourth segment. A spacing between the first segment and the third segment is smaller than a spacing between the second segment and the fourth segment. The first segment and the third segment provide a first impedance, and the second segment and the fourth segment provide a second impedance. The first impedance is smaller than the second impedance. The first signal transmission node and the third signal transmission node respectively receive a first signal and a second signal of a differential signal pair.

In an embodiment of the invention, a frequency of the first signal and a frequency of the second signal are in a range between 0 Hz and 30 GHz.

In an embodiment of the invention, the first signal transmission node and the third signal transmission node are respectively coupled to the first conductive bump and the second conductive bump, and the second signal transmission node and the fourth signal transmission node are respectively coupled to the third conductive bump and the fourth conductive bump.

In an embodiment of the invention, the first conductive bump and the second conductive bump are gold bumps, and the third conductive bump and the fourth conductive bump are conductive balls.

In an embodiment of the invention, the first conductive transmission line and the second conductive transmission line are disposed on the same plane of the circuit substrate.

According to an embodiment of the invention, the circuit board structure includes a circuit substrate, a plurality of signal transmission nodes, one or more first conductive transmission lines as described above, and one or more second conductive transmission lines as described above. The signal transmission node is disposed on the circuit substrate. The first conductive transmission line and the second conductive transmission line are disposed on the same active surface of the circuit substrate.

Based on the above, the embodiments of the invention provide a two-segment layout method for disposing conductive transmission lines. This layout method can perform a transmission impedance conversion to increase the uniformity of the impedance variations between the transmission paths of the first conductive transmission line and the second conductive transmission line by using the first segment of the first conductive transmission line and the third segment of the second conductive transmission line as a bridge structure. Therefore, signal reflections that may occur during signal transmission are reduced, and the quality of the transmission signal is improved.

In order to make the above features and advantages of the disclosure more obvious and understandable, several embodiments accompanied with figures are described in detail as follows.

DESCRIPTION OF EMBODIMENTS

Figure 2:
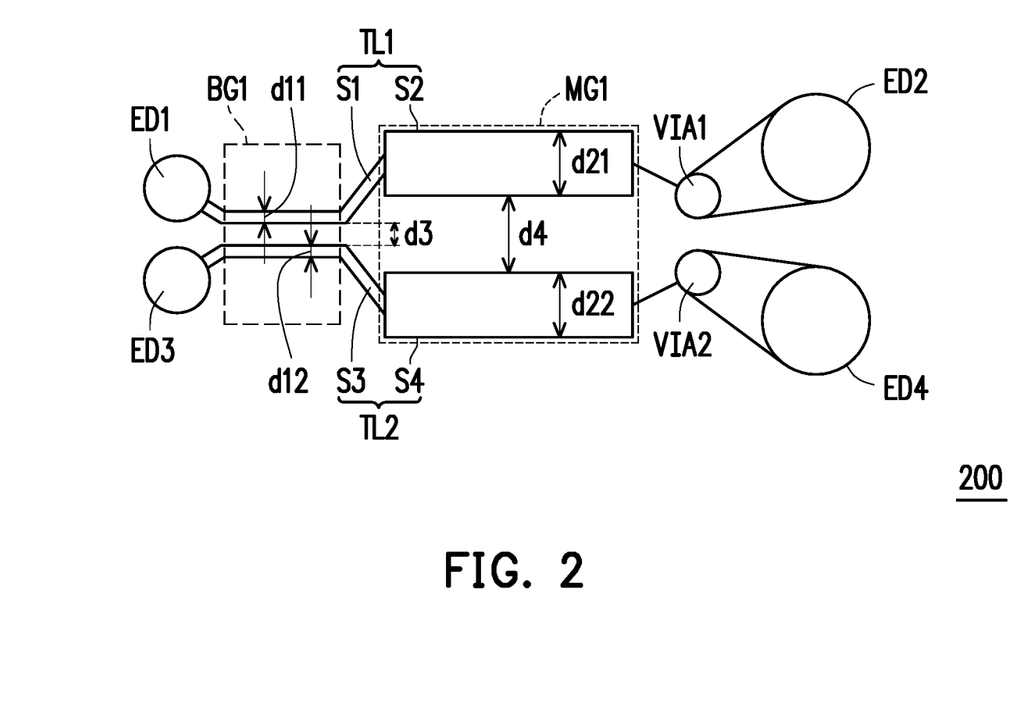
FIG. 2 is a schematic diagram of a conductive transmission line structure according to an embodiment of the invention.

Please refer to FIG. 2. FIG. 2 is a schematic diagram of a conductive transmission line structure according to an embodiment of the invention. A conductive transmission line structure 200 includes conductive transmission lines TL1 and TL2. The conductive transmission line TL1 consists of segment S1 and segment S2, and the conductive transmission line TL2 consists of segment S3 and segment S4. The segment S1 and the segment S2 are sequentially connected between the signal transmission nodes ED1 and ED2. Segment S3 and segment S4 are sequentially connected between the signal transmission nodes ED3 and ED4. It should be noted that the segment S1 of the conductive transmission line TL1 is disposed adjacent to the segment S3 of the conductive transmission line TL2 to form a bridge segment BG1. The segment S2 of the conductive transmission line TL1 is adjacent to the segment S4 of the conductive transmission line TL2 to form a main transmission segment MG1 for transmitting signals.

In this embodiment, the bridge segment BG1 is used as an impedance conversion component. The bridge segment BG1 can provide a first impedance which is used for comparing with a second impedance provided by the main transmission segment MG1. The first impedance is smaller than the second impedance.

In one embodiment of the invention, one signal transmission path is formed by the signal transmission node ED1, the segment S1 of the conductive transmission line TL1, and the segment S2 of the conductive line TL1. Another signal transmission path is formed by the signal transmission node ED3, the segment S3 of the conductive transmission line TL2, and the segment S4 of the conductive transmission line TL2. Based on the first impedance provided by the bridge segment BG1, the continuity of the impedance variations on the above two signal transmission paths can be simultaneously improved. In addition, the signal reflections that may occur on the conductive transmission lines TL1 and TL2 can be reduced, and the quality of signal transmission is improved.

In addition, in the implementation details of the conductive transmission lines TL1 and TL2, the line widths of the segments S1 and S3 for forming the bridge segment BG1 are respectively smaller than the line widths of the segments S2 and S4 for forming the main transmission segment MG1. In this embodiment, segments S1 and S3 respectively have line width d11, d12, and segments S2 and S4 respectively have line width d21, d22. The line width d11 is smaller than the line width d21, and the line width d12 is smaller than the line width d22. In this embodiment, the segments S1 and S3 have a spacing d3, the segments S2 and S4 have a spacing d4, and the spacing d3 is smaller than the spacing d4.

It should be noted that the line width d11 of the segment S1 can be substantially equal to the line width d12 of the segment S3, and the line width d21 of the segment S2 can be substantially equal to the line width d22 of the segment S4. Due to the manufacturing process there may be a difference between the line width d11 and the line width d12 within a tolerance range, and there may also be a difference between the line width d21 and the line width d22 within a tolerance range. If the mentioned tolerance ranges are ignored, the line width d11 can be equal to the line width d12, and the line width d21 can be equal to the line width d22.

In an embodiment of the invention, the bridge segment BG1 formed by the segments S1 and S3 can provide, for example, a capacitance dominant impedance of 75 ohms through a parasitic capacitance between segments S1 and S3. On the other hand, the main transmission section MG1 formed by the segments S2 and S4 can provide, for example, an impedance of 90 ohms. In this way, when signal transmission operations are respectively performed between the signal transmission node ED1 and the conductive transmission line TL1, and between the signal transmission node ED3 and the conductive transmission line TL2, the signal reflections that may occur can be reduced to improve the transmission quality of transmission signals. It should be noted that, in one embodiment of the invention, the segments S1 and S3 forming the bridge segment BG1 have a relatively small spacing d3, and the segments S2 and S4 forming the main transmission section MG1 have a relatively large spacing d4. Therefore, a relatively large parasitic capacitance can be formed between segment S1 and S3, and a relatively small parasitic capacitance can be formed between segment S2 and S4. The impedance formula can be expressed as follows:

$$Z = \sqrt{\frac{R1 + j\omega L1}{G1 + j\omega C1}},$$

where R1 and G1 are the resistance and conductance of the conductive transmission line, respectively. L1 is the length of the conductive transmission line, and C1 is the parasitic capacitance between two segments. It can be seen from the impedance formula that the bridge segment BG1 having a relatively large parasitic capacitance can provide a relatively small impedance.

On the other hand, in this embodiment, the conductive transmission lines TL1 and TL2 can be respectively connected to the signal transmission nodes ED2 and ED4 through via VIA1 and VIA2. In one embodiment of the invention, the conductive transmission lines TL1 and TL2 are respectively used for transmitting a first signal and a second signal of a differential signal pair. In addition, a frequency of the first signal and a frequency of the second signal are in a range between 0 Hz and 30 GHz.

Moreover, in one embodiment of the invention, the signal transmission nodes ED1 and ED3 are respectively coupled to different conductive bumps. The conductive bumps respectively coupled to the signal transmission nodes ED1 and ED3 are, for example, gold bumps. The signal transmission nodes ED2 and ED4 are respectively coupled to different conductive bumps. The conductive bumps respectively coupled to the signal transmission nodes ED2 and ED4 can be conductive balls, such as conductive balls for a Ball Grid Array (BGA) package.

Figure 3:
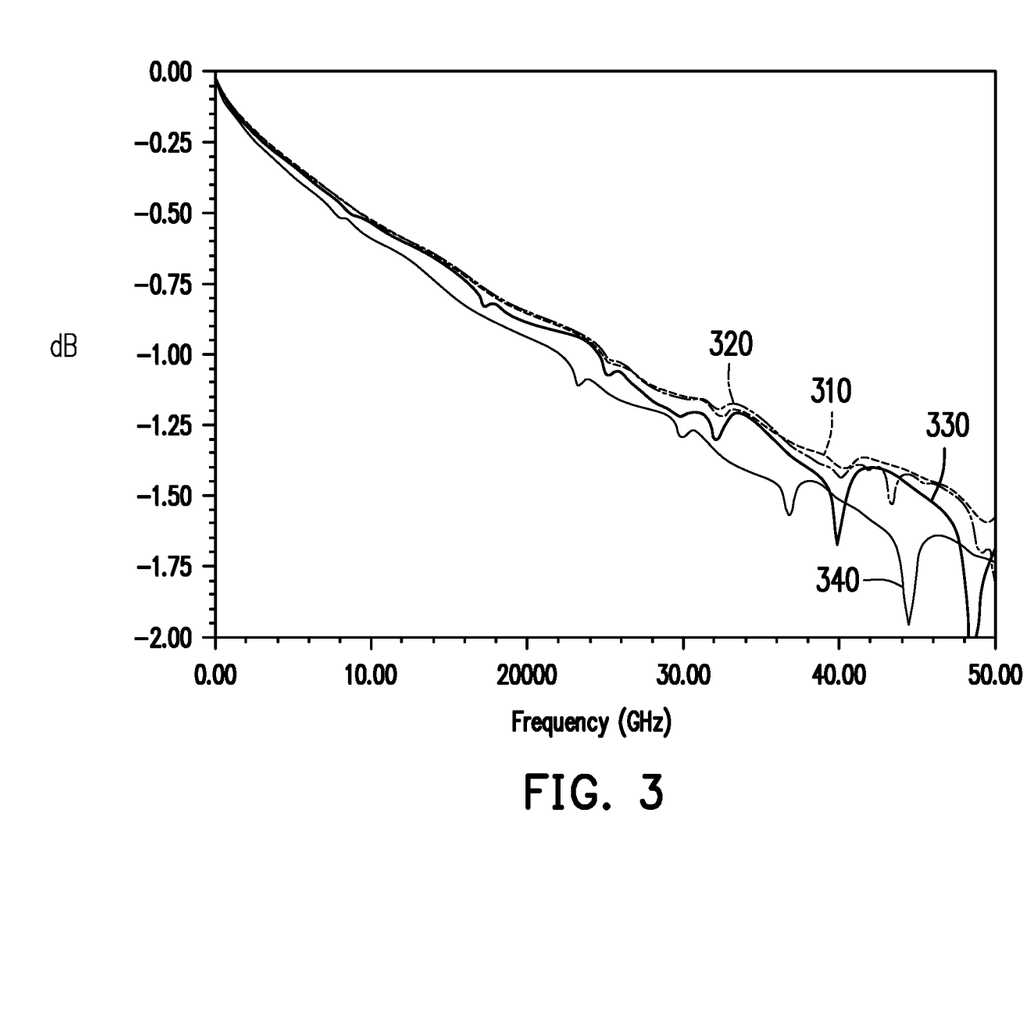
FIG. 3 is a S-Parameter plot of transmission signals from a conductive transmission line structure according to an embodiment of the invention.

Please refer to FIG. 3. FIG. 3 is a S-Parameter plot of transmission signals from a conductive transmission line structure according to an embodiment of the invention. The curves 310, 320, 330 and 340 shown in FIG. 3 respectively represent frequency responses of transmission signals from the conductive transmission line structure of FIG. 2 in different transmission channels. It can be clearly seen from FIG. 3 that the harmonic waves on the transmission signals can be effectively suppressed in the frequency band below 30 GHz, and the signal quality can be greatly improved.

Figure 4:
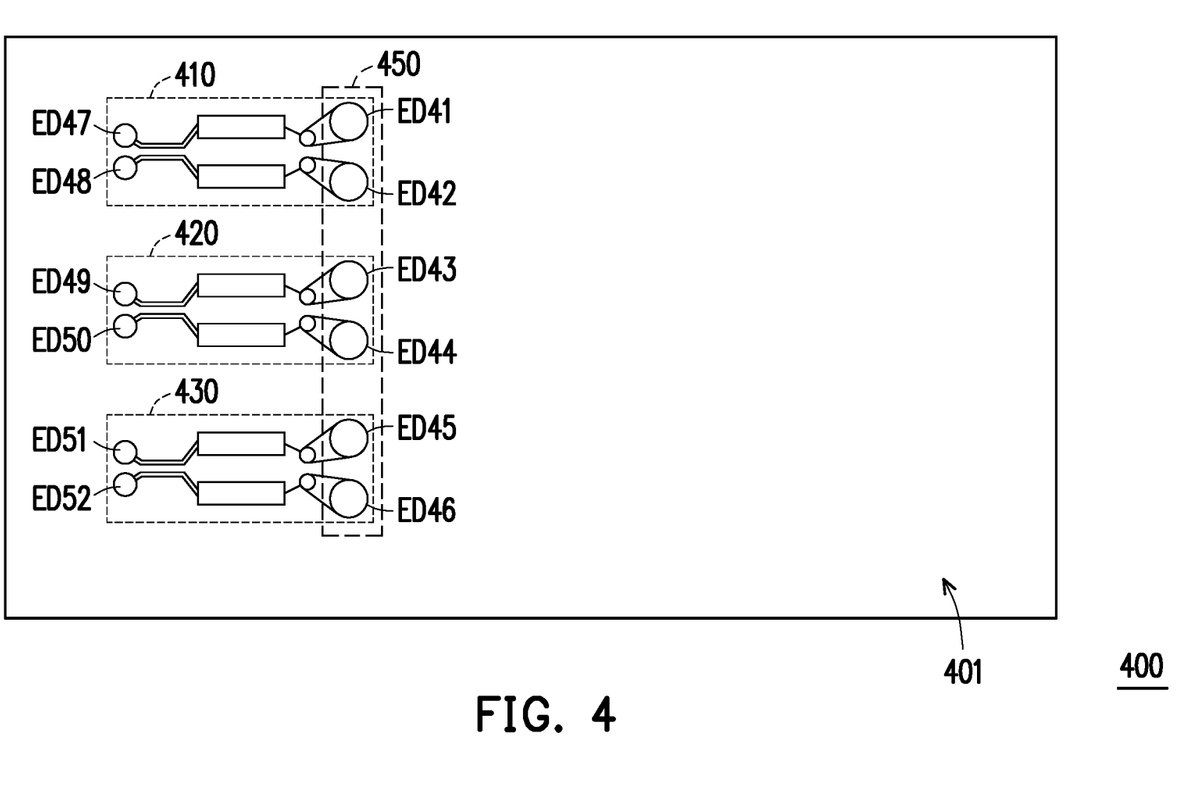
FIG. 4 is a schematic diagram of a circuit board structure according to an embodiment of the invention.

Please refer to FIG. 4. FIG. 4 is a schematic diagram of a circuit board structure according to an embodiment of the invention. The circuit board structure 400 includes a circuit substrate 401 and a plurality of conductive transmission line structures 410, 420 and 430. The conductive transmission line structure 410 is disposed between the signal transmission nodes ED41 and ED42 and the signal transmission nodes ED47 and ED48. The conductive transmission line structure 420 is disposed between the signal transmission nodes ED43 and ED44 and the signal transmission nodes ED49 and ED50. The conductive transmission line structure 430 is disposed between the signal transmission nodes ED45 and ED46 and the signal transmission nodes ED51 and ED52. In this embodiment, the circuit board structure 400 can be a package carrier structure in a flip chip package. The signal transmission nodes ED41~ED46 can be disposed in the region 450. Conductive bumps may be disposed on the signal transmission nodes ED41~ED46 to adhere to a chip.

In this embodiment, the conductive transmission line structures 410, 420 and 430 can be implemented by using the embodiment of the conductive transmission line structure 200. In addition, one or multiple conductive transmission line structures can be disposed on the circuit board structure 400. The number of conductive transmission line structures shown in FIG. 4 is only an example and is not intended to limit the scope of the invention.

Figure 5A:
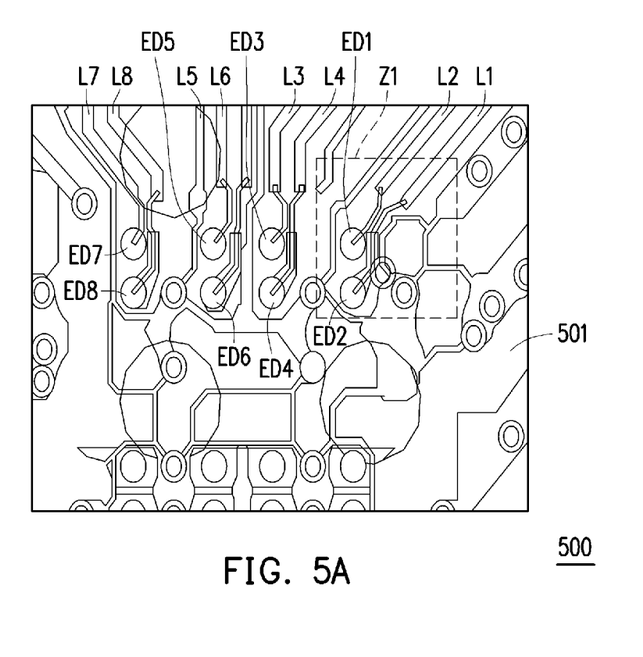
FIG. 5A is a schematic diagram of a circuit board structure according to another embodiment of the invention.
Figure 5B:
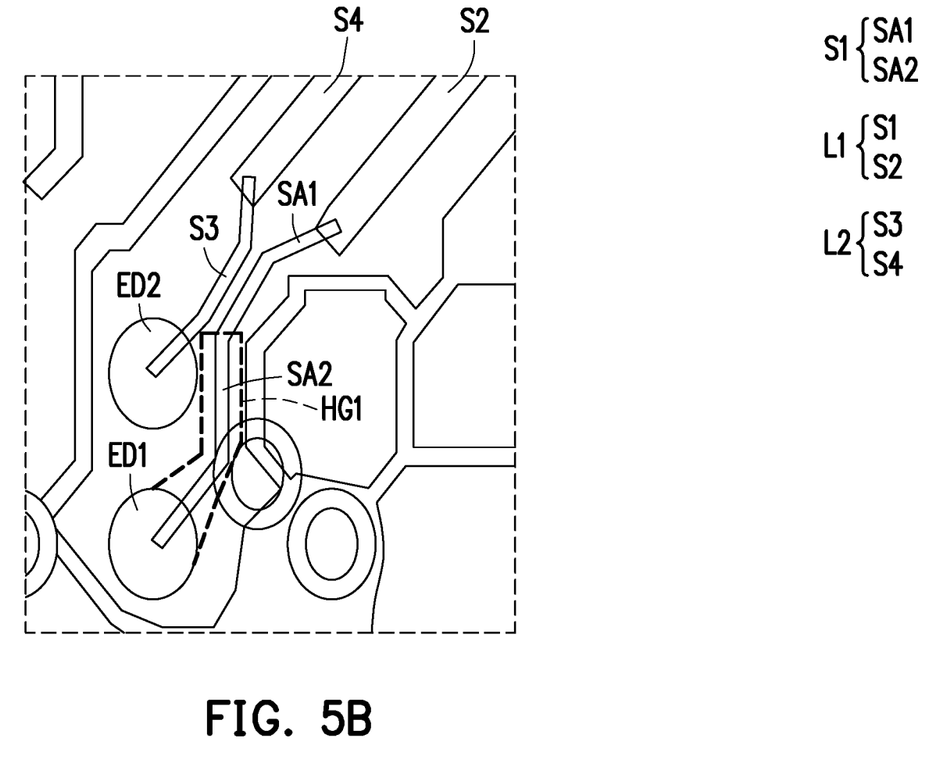
FIG. 5B is a partial enlarged view of the circuit board structure shown in FIG. 5A.

Please refer to FIG. 5A and FIG. 5B. FIG. 5A is a schematic diagram of a circuit board structure according to another embodiment of the invention, and FIG. 5B is a partial enlarged view of the circuit board structure shown in FIG. 5A. In FIG. 5A, the circuit board structure 500 includes a circuit substrate 501, a plurality of conductive transmission lines L1~L8, and signal transmission nodes ED1~ED8. The conductive transmission lines L1~L8 are sequentially divided into multiple pairs of conductive transmission lines to form a plurality of conductive transmission line structures, and the conductive transmission lines L1~L8 are respectively coupled to a plurality of signal transmission nodes ED1~ED8. The signal transmission nodes ED1~ED8 are respectively coupled to a plurality of conductive bumps. The conductive transmission lines L1~L8 and the signal transmission nodes ED1~ED8 are disposed on the same surface of the circuit substrate 501. A partial enlarged view of the region Z1 is shown in FIG. 5B.

In FIG. 5B, the conductive transmission line L1 includes a segment S1 and a segment S2, and the conductive transmission line L2 includes a segment S3 and a segment S4. The segment S1 is disposed adjacent to the segment S3, and the segment S2 is disposed adjacent to the segment S4. When considering a condition that the length of the segment S1 is longer than the length of the segment S3, the segment S1 can be defined as subsegment SA1 and subsegment SA2 according to the length of the segment S3. Specifically, the length of the subsegment SA1 can be close to the length of the segment S3, and the subsegment SA1 is disposed adjacent to the segment S3. The subsegment SA2 is disposed between the subsegment SA1 and the signal transmission node ED1. To improve the impedance matching between the segments S1 and S3 in the circuit board structure 500, a hollow ground structure HG1 can be disposed under the plane of the subsegment SA2.

Figure 6:
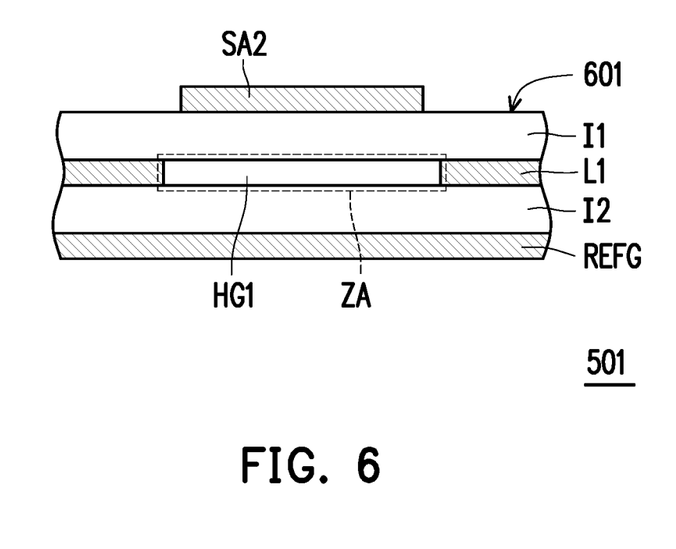
FIG. 6 is a cross-sectional view of a hollow ground structure according to an embodiment of the invention.

The arrangement of the hollow ground structure HG1 is shown in FIG. 6. FIG. 6 is a cross-sectional view of a hollow ground structure according to an embodiment of the invention. Taking the circuit substrate 501 having a multi-layer structure as an example, the circuit substrate 501 has a dielectric layer I1, a conductive wiring layer L1, a dielectric layer I2, and a reference ground layer REFG. The dielectric layer I1, the conductive wiring layer L1, the dielectric layer I2, and the reference ground layer REFG are sequentially stacked with each other. On the circuit substrate 501, the subsegment SA2 can be disposed on the surface 601 of the circuit substrate 501. The region ZA of the conductive wiring layer L1 is in a hollow state corresponding to the vertical projection plane of the subsegment SA2, and the region ZA forms a hollow ground structure HG1. The capacitance between the subsegment SA2 and the reference ground layer REFG can be adjusted by the hollow ground structure HG1, and the impedance provided by the subsegment SA2 can also be adjusted.

The hollow ground structure HG1 shown in FIG. 6 is just an example, and any method well known to those skilled in the art for implementing a hollow structure can be applied to the embodiments of invention without other particular limitations.

In summary, the embodiments of the invention provide a two-segment conductive transmission line. A first segment of a first conductive transmission line and a third segment of a second conductive transmission line are used for forming a bridge segment, and an impedance conversion for signal transmission can be performed by using the bridge segment. Therefore, the uniformity of the variations from the transmission impedances provided by the bridge segment and the main transmission segment can be improved. Moreover, the harmonic waves on the transmission signal can be reduced, and the transmission quality of transmission signals can be improved.

Although the disclosure has been disclosed by the above embodiments, it will be apparent to those skilled in the art that various modifications to the described embodiments can be made without departing from the scope or spirit of the disclosure. Therefore, the scope of the disclosure will be defined by the attached claims and not by the above detailed descriptions.

What is claimed is:

1. A conductive transmission line structure, comprising:
a first conductive transmission line, including a first segment and a second segment, wherein the first segment is coupled between a first signal transmission node and the second segment, and the second segment is coupled to a second signal transmission node; and
a second conductive transmission line, including a third segment and a fourth segment, wherein the third segment is coupled between a third signal transmission node and the fourth segment, and the fourth segment is coupled to a fourth signal transmission node,
wherein the first segment is disposed adjacent to the third segment, the second segment is disposed adjacent to the fourth segment, a line width of the first segment is smaller than a line width of the second segment, a line width of the third segment is smaller than a line width of the fourth segment, and a spacing between the first segment and the third segment is smaller than a spacing between the second segment and the fourth segment,
wherein the first segment and the third segment provide a first impedance, the second segment and the fourth segment provide a second impedance, the first impedance is smaller than the second impedance, and the first signal transmission node and the third signal transmission node respectively receive a first signal and a second signal of a differential signal pair.

2. The conductive transmission line structure according to claim 1, wherein a frequency of the first signal and a frequency of the second signal are in a range between 0 Hz and 30 GHz.

3. The conductive transmission line structure according to claim 1, wherein the first signal transmission node and the third signal transmission node are respectively coupled to a first conductive bump and a second conductive bump, the second signal transmission node and the fourth signal transmission node are respectively coupled to a third conductive bump and a fourth conductive bump.

4. The conductive transmission line structure according to claim 3, wherein the first conductive bump and the second conductive bump are gold bumps, and the third conductive bump and the fourth conductive bump are conductive balls.

5. The conductive transmission line structure according to claim 1, wherein the first conductive transmission line and the second conductive transmission line are disposed on a same plane of a circuit substrate.

6. A circuit board structure, comprising:
a circuit substrate;
a plurality of signal transmission nodes disposed on the circuit substrate;
at least one first conductive transmission line, disposed on an active surface of the circuit substrate, wherein the at least one first conductive transmission line includes a first segment and a second segment, the first segment is coupled between a first signal transmission node and the second segment, and the second segment is coupled to a second signal transmission node; and
at least one second conductive transmission line, disposed on the active surface of the circuit substrate, wherein the at least one second conductive transmission line includes a third segment and a fourth segment, the third segment is coupled between a third signal transmission node and the fourth segment, and the fourth segment is coupled to a fourth signal transmission node,
wherein the first segment is disposed adjacent to the third segment, the second segment is disposed adjacent to the fourth segment, a line width of the first segment is smaller than a line width of the second segment, a line width of the third segment is smaller than a line width of the fourth segment, and a spacing between the first segment and the third segment is smaller than a spacing between the second segment and the fourth segment,
wherein the first segment and the third segment provide a first impedance, the second segment and the fourth segment provide a second impedance, the first impedance is smaller than the second impedance, and the first signal transmission node and the third signal transmission node respectively receive a first signal and a second signal of a differential signal pair.

7. The circuit board structure according to claim 6, wherein when a length of the first segment is larger than a length of the third segment, the first segment is defined as a first subsegment and a second subsegment, the second subsegment is disposed corresponding to the third segment, and a length of the second subsegment is substantially the same as the length of the third segment, wherein the first subsegment and the second subsegment are respectively disposed on a first region and a second region of the circuit substrate, and the first region of the circuit substrate has a hollow ground structure.

8. The circuit board structure according to claim 6, wherein a frequency of the first signal and a frequency of the second signal are in a range between 0 Hz and 30 GHz.

9. The circuit board structure according to claim 6, wherein the first signal transmission node and the third signal transmission node are respectively coupled to a first conductive bump and a second conductive bump, the second signal transmission node and the fourth signal transmission node are respectively coupled to a third conductive bump and a fourth conductive bump.

10. The circuit board structure according to claim 6, wherein the at least one first conductive transmission line and the at least one second conductive transmission line are disposed on the same plane of the circuit substrate.

\* \* \* \* \*